(12) United States Patent
Nishizawa et al.

(10) Patent No.: US 11,990,887 B2
(45) Date of Patent: May 21, 2024

(54) VIBRATOR DEVICE AND VIBRATOR MODULE

(71) Applicant: SEIKO EPSON CORPORATION, Tokyo (JP)

(72) Inventors: Ryuta Nishizawa, Nagano (JP); Shinya Aoki, Minowa-machi (JP); Atsushi Matsuo, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 676 days.

(21) Appl. No.: 17/230,186

(22) Filed: Apr. 14, 2021

(65) Prior Publication Data
US 2021/0336600 A1    Oct. 28, 2021

(30) Foreign Application Priority Data
Apr. 22, 2020 (JP) ................................ 2020-076348

(51) Int. Cl.
| | | |
|---|---|---|
| H03H 9/10 | (2006.01) | |
| H03H 9/05 | (2006.01) | |
| H03H 9/215 | (2006.01) | |

(52) U.S. Cl.
CPC ........ *H03H 9/1021* (2013.01); *H03H 9/0519* (2013.01); *H03H 9/215* (2013.01)

(58) Field of Classification Search
None
See application file for complete search history.

(56) References Cited

U.S. PATENT DOCUMENTS

| | | | |
|---|---|---|---|
| 2009/0267460 A1* | 10/2009 | Satoh | H03H 9/17 29/25.35 |
| 2011/0187236 A1 | 8/2011 | Satoh et al. | |
| 2015/0022060 A1 | 1/2015 | Kanamaru et al. | |
| 2019/0301868 A1* | 10/2019 | Yamaguchi | G01C 19/5607 |
| 2021/0063156 A1* | 3/2021 | Oshio | G01C 19/5663 |
| 2022/0294392 A1* | 9/2022 | Matsuo | H03H 9/0552 |
| 2023/0208388 A1* | 6/2023 | Mizugaki | H03H 9/19 310/344 |

FOREIGN PATENT DOCUMENTS

| | | |
|---|---|---|
| JP | 02-261210 | 10/1990 |
| JP | 2007-195138 A | 8/2007 |
| JP | 2008-166884 | 7/2008 |
| JP | 2009-081670 | 4/2009 |
| JP | 2009-302701 | 12/2009 |
| JP | 2011-147053 A | 7/2011 |
| JP | 2012-134792 | 7/2012 |
| JP | 2013-098678 | 5/2013 |
| JP | 2015-039162 | 2/2015 |

* cited by examiner

*Primary Examiner* — J. San Martin
(74) *Attorney, Agent, or Firm* — Rankin, Hill & Clark LLP

(57) ABSTRACT

The vibrator device includes a vibrator element, a relay substrate, a base, an element-side bonding member for bonding the vibrator element and the relay substrate to each other, and a base-side bonding member for bonding the base and the relay substrate to each other. Further, the element-side bonding member has a first bonding member and s second bonding member arranged side by side along an A axis. Further, an X axis of a first quartz crystal substrate provided to the vibrator element is parallel to the A axis, and a second quartz crystal substrate provided to the relay substrate is a Z-cut quartz crystal substrate.

10 Claims, 16 Drawing Sheets

VIBRATOR DEVICE AND VIBRATOR MODULE

The present application is based on, and claims priority from JP Application Serial Number 2020-076348, filed Apr. 22, 2020, the disclosure of which is hereby incorporated by reference herein in its entirety.

BACKGROUND

1. Technical Field

The present disclosure relates to a vibrator device and a vibrator module.

2. Related Art

A piezoelectric vibrator device described in JP-A-2008-166884 (Document 1) has base made of ceramics, a piezoelectric vibrator element formed of an AT-cut quartz crystal substrate, and a support member formed of a Z-cut quartz crystal substrate. Further, the piezoelectric vibrator element is supported by the base via the support member. Further, a pair of first metal bumps are disposed between the base and the support member, and the base and the support member are mechanically and electrically coupled to each other with the pair of first metal bumps. Further, a pair of second metal bumps are disposed between the support member and the piezoelectric vibrator element, and the support member and the piezoelectric vibrator element are mechanically and electrically coupled to each other with the pair of second metal bumps.

It should be noted that although an X axis is described along a longitudinal direction of the piezoelectric vibrator element in FIG. 1 of Document 1, there is no description which explains the X axis in the detailed description of the specification. Therefore, it is unclear whether the X axis represents the electrical axis of the AT-cut quartz crystal substrate constituting the piezoelectric vibrator element or simply represents a three-dimensional coordinate system.

In such a piezoelectric vibrator device of Document 1, the support member intervenes between the base and the piezoelectric vibrator element. Therefore, there are increased number of interfaces between the members different in linear expansion coefficient from each other such as an interface between the base and the first metal bumps, an interface between the first metal bumps and the support member, an interface between the support member and the second metal bumps, and an interface between the second metal bumps and the piezoelectric vibrator element. When the number of interfaces between the members different in linear expansion coefficient from each other increases as described above, there arises a problem that the stress applied to the piezoelectric vibrator element due to the difference in linear expansion coefficient increases, and thus, the deformation of the piezoelectric vibrator element increases to deteriorate the frequency accuracy.

SUMMARY

A vibrator device according to the present disclosure includes a vibrator element including a first quartz crystal substrate including a first surface and a second surface which are in an obverse-reverse relationship, and which extend along an X axis as an electrical axis, a first excitation electrode disposed on the first surface, a second excitation electrode disposed on the second surface so as to be opposed to the first excitation electrode, a first terminal which is disposed on the first surface, and which is electrically coupled to the first excitation electrode, and a second terminal which is disposed on the first surface, and which is electrically coupled to the second excitation electrode, a base including a substrate located at the first surface side of the vibrator element, a first substrate interconnection provided to the substrate, and a second substrate interconnection provided to the substrate, a relay substrate including a second quartz crystal substrate which is disposed between the vibrator element and the base, and a thickness direction of which is parallel to a Z axis as an optical axis, a first relay interconnection disposed on a third surface at the vibrator element side of the second quartz crystal substrate, a second relay interconnection disposed on the third surface, a third relay interconnection which is disposed on a fourth surface having an obverse-reverse relationship with the third surface and located on the base side, and which is electrically coupled to the first relay interconnection, and a fourth relay interconnection which is disposed on the fourth surface, and which is electrically coupled to the second relay interconnection, an element-side bonding member which includes a first bonding member configured to electrically couple the first terminal and the first relay interconnection to each other, and a second bonding member configured to electrically couple the second terminal and the second relay interconnection to each other, and which is configured to bond the vibrator element and the relay substrate to each other, and a base-side bonding member which includes a third bonding member configured to electrically couple the first substrate interconnection and the third relay interconnection to each other, and a fourth bonding member configured to electrically couple the second substrate interconnection and the fourth relay interconnection to each other, and which is configured to bond the base and the relay substrate to each other, wherein the first bonding member and the second bonding member are arranged side by side in a direction along the X axis.

A vibrator module according to the present disclosure includes the vibrator device described above.

DESCRIPTION OF EXEMPLARY EMBODIMENTS

A vibrator device and a vibrator module according to the present disclosure will hereinafter be described in detail based on some embodiments shown in the accompanying drawings.

First Embodiment

Figure 1:
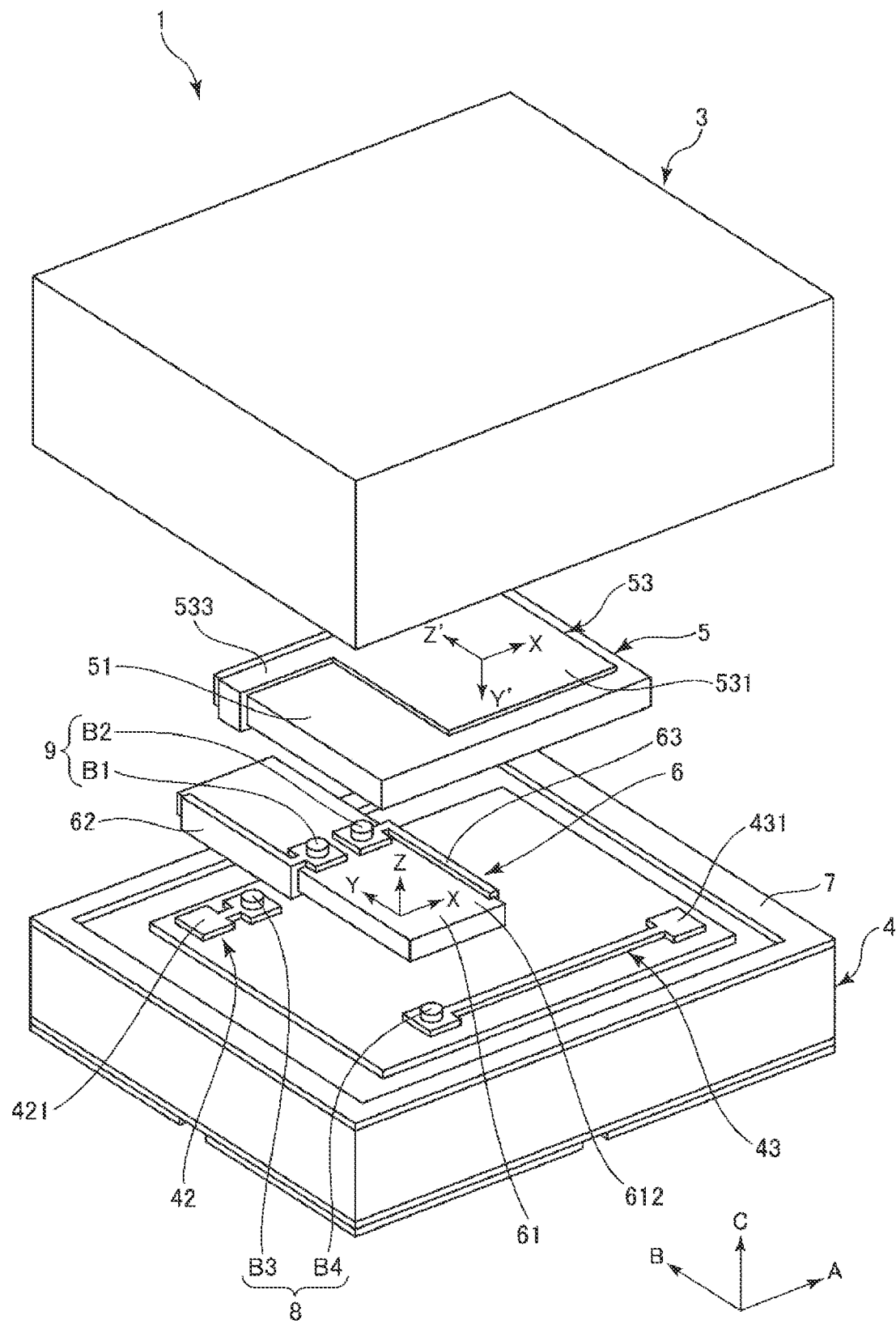
FIG. 1 is an exploded perspective view of a vibrator device according to a first embodiment of the present disclosure.
Figure 2:
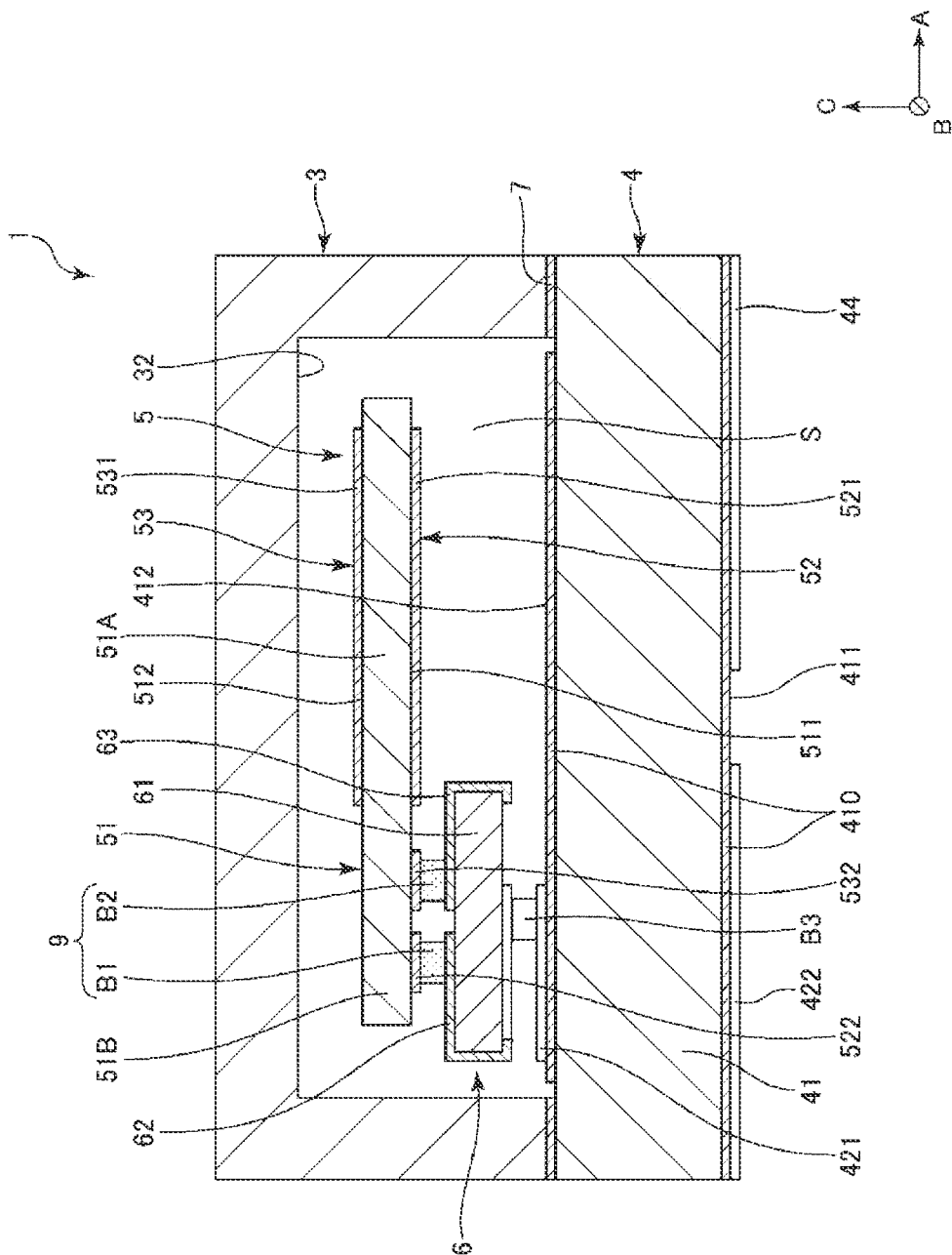
FIG. 2 is a cross-sectional view of the vibrator device shown in FIG. 1.
Figure 3:
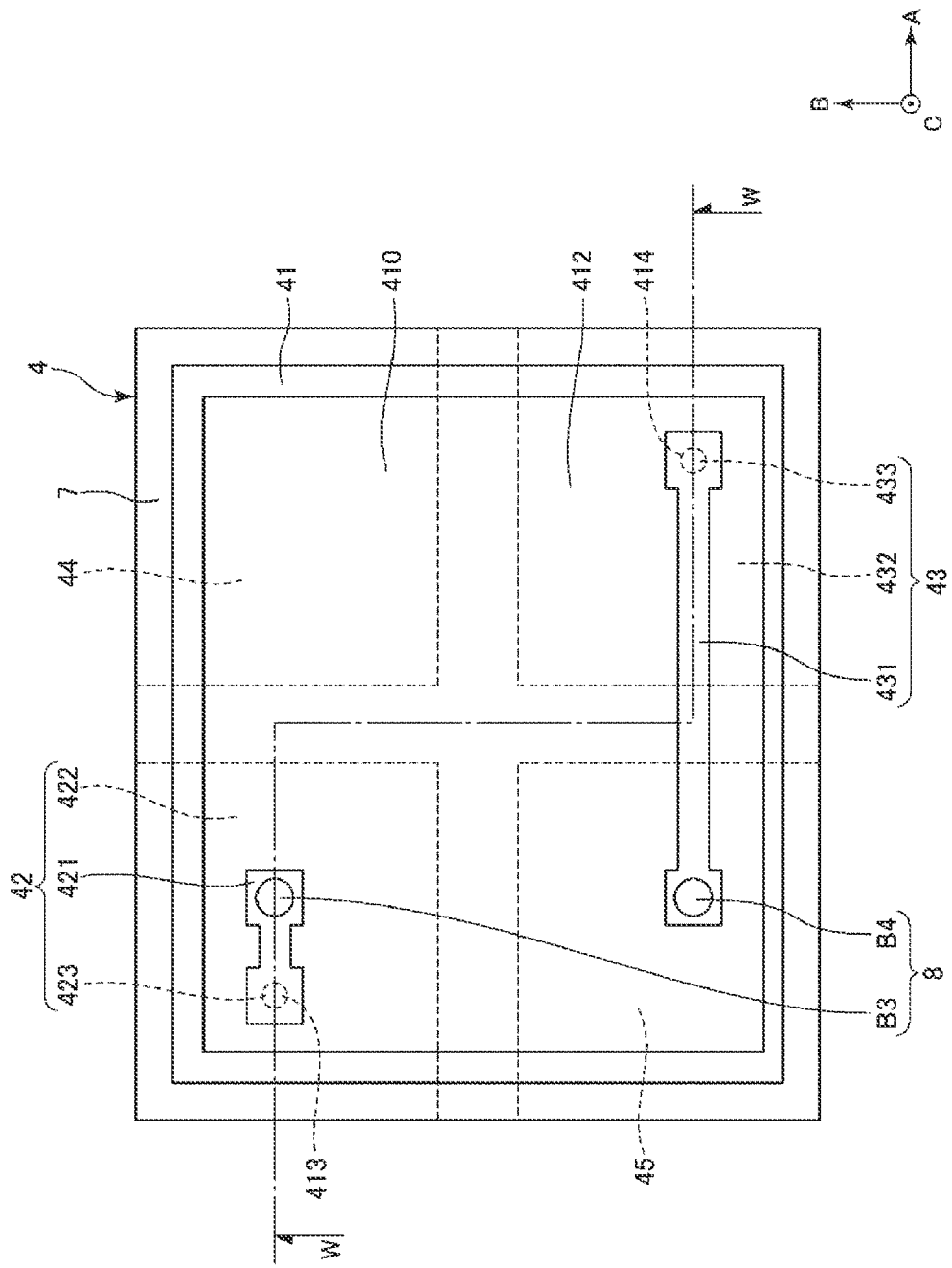
FIG. 3 is a plan view showing a base.
Figure 4:
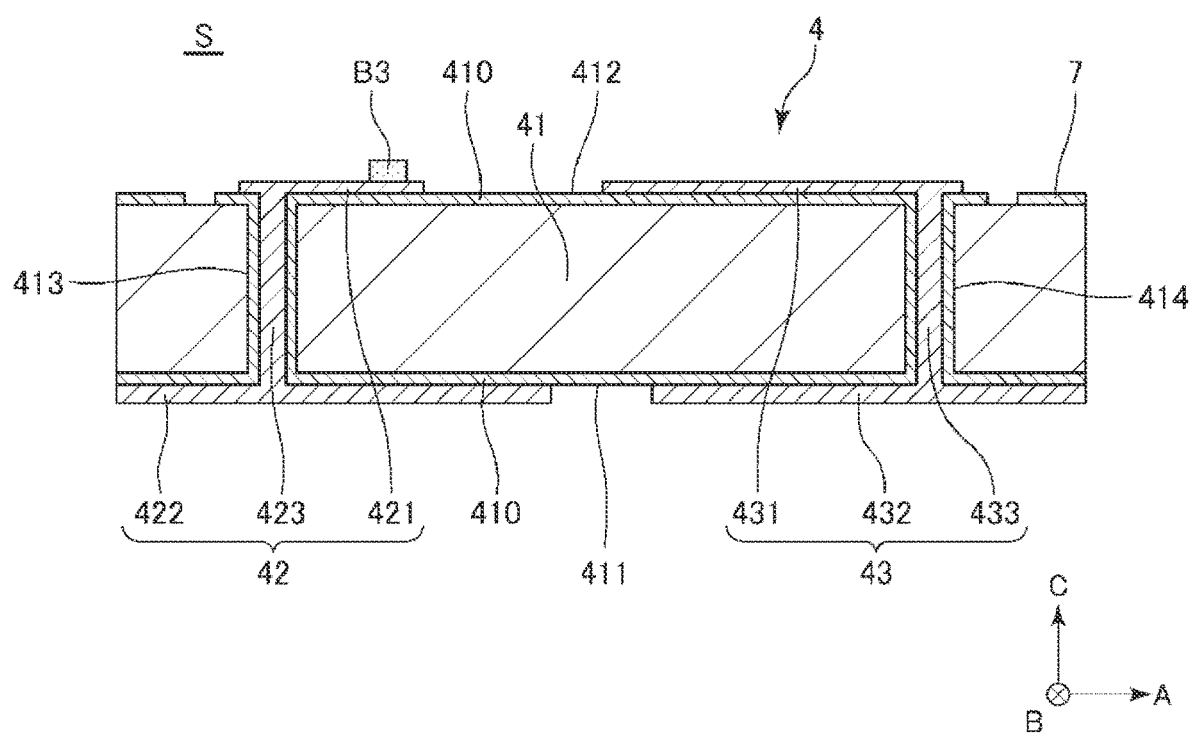
FIG. 4 is a cross-sectional view along the line W-W in FIG. 3.
Figure 5:
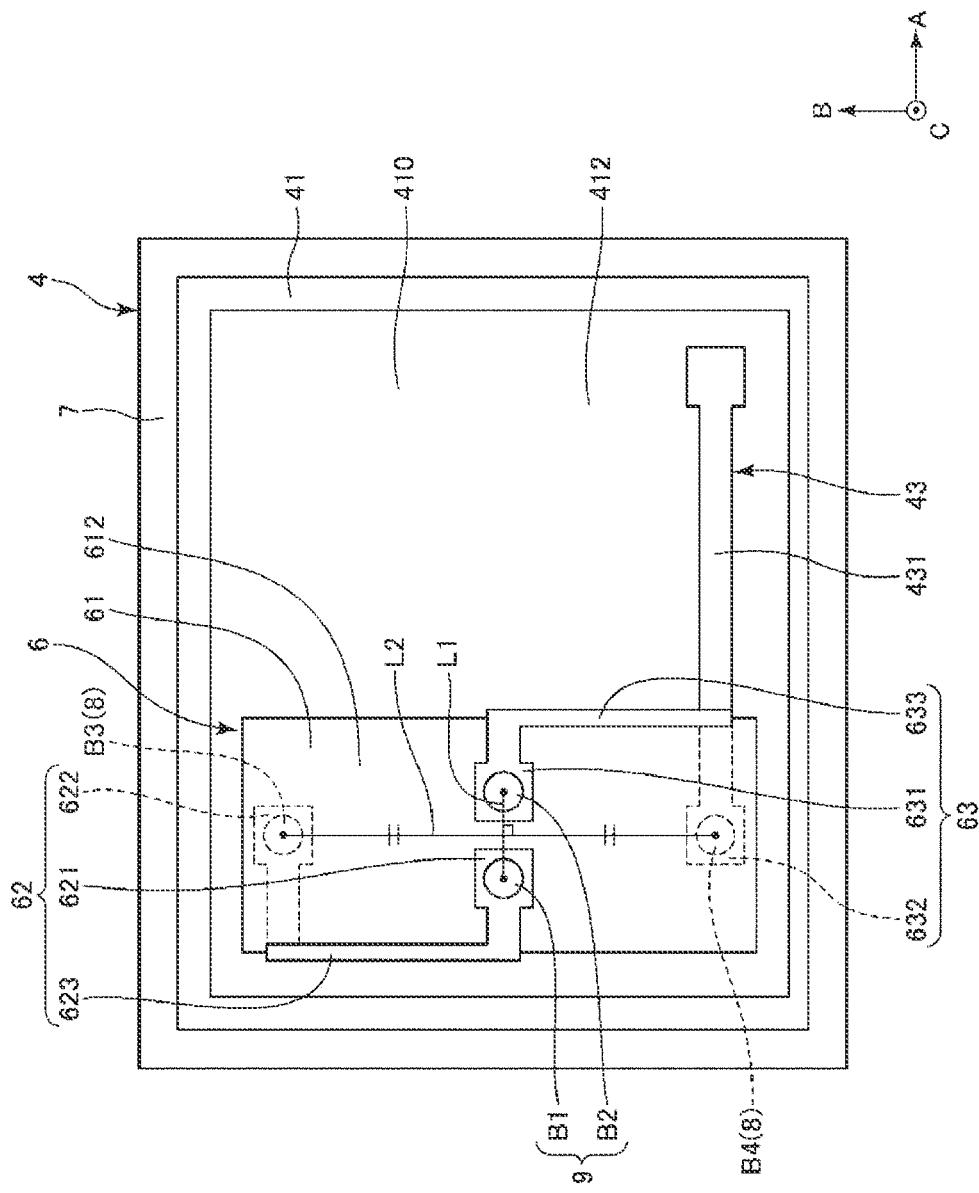
FIG. 5 is a plan view showing a relay substrate.
Figure 6:
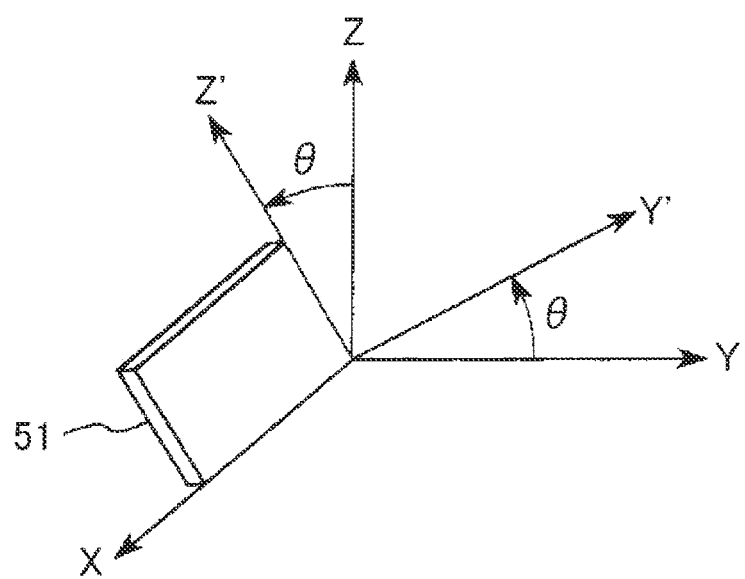
FIG. 6 is a diagram showing a cutting angle of AT cut.
Figure 7:
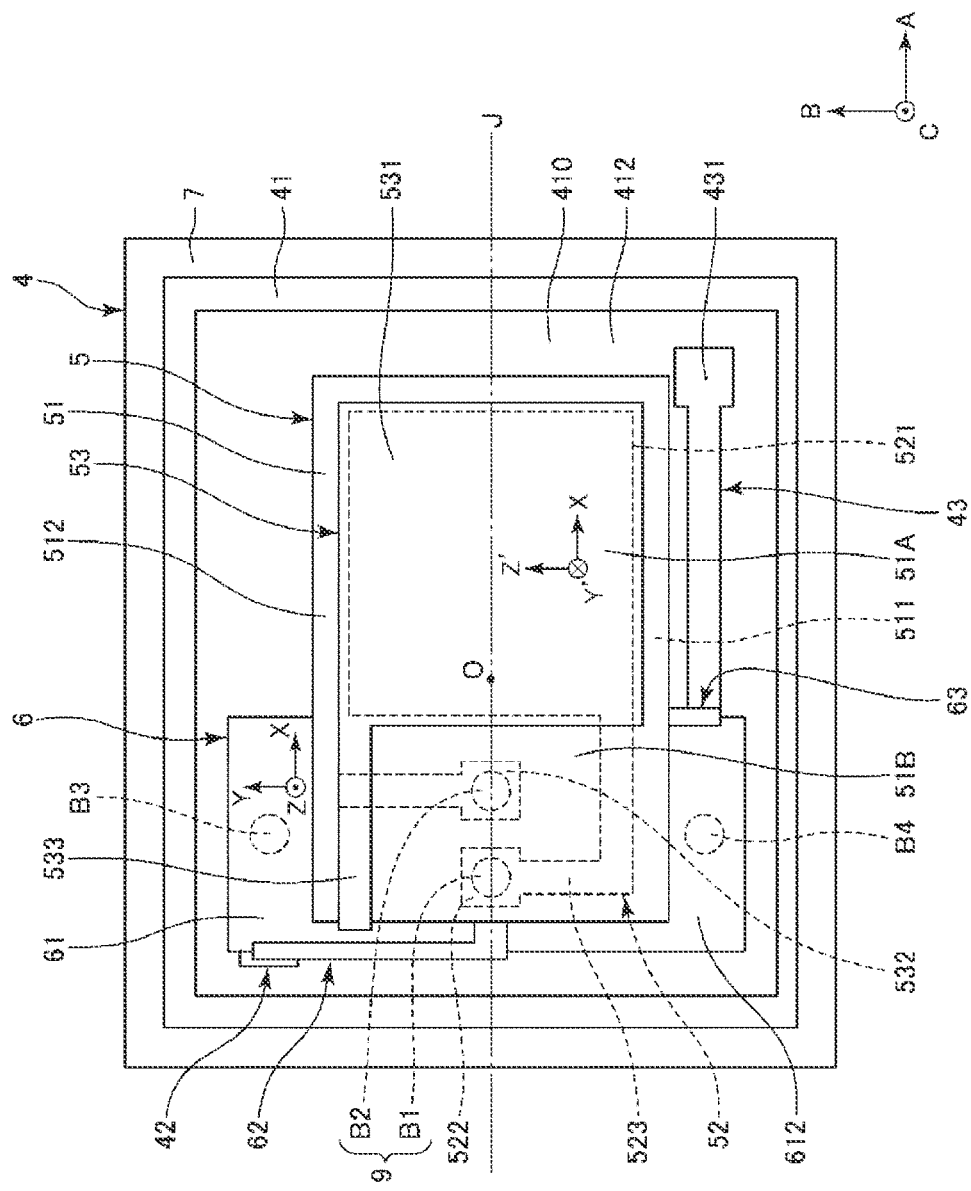
FIG. 7 is a plan view showing a vibrator element.
Figure 8:
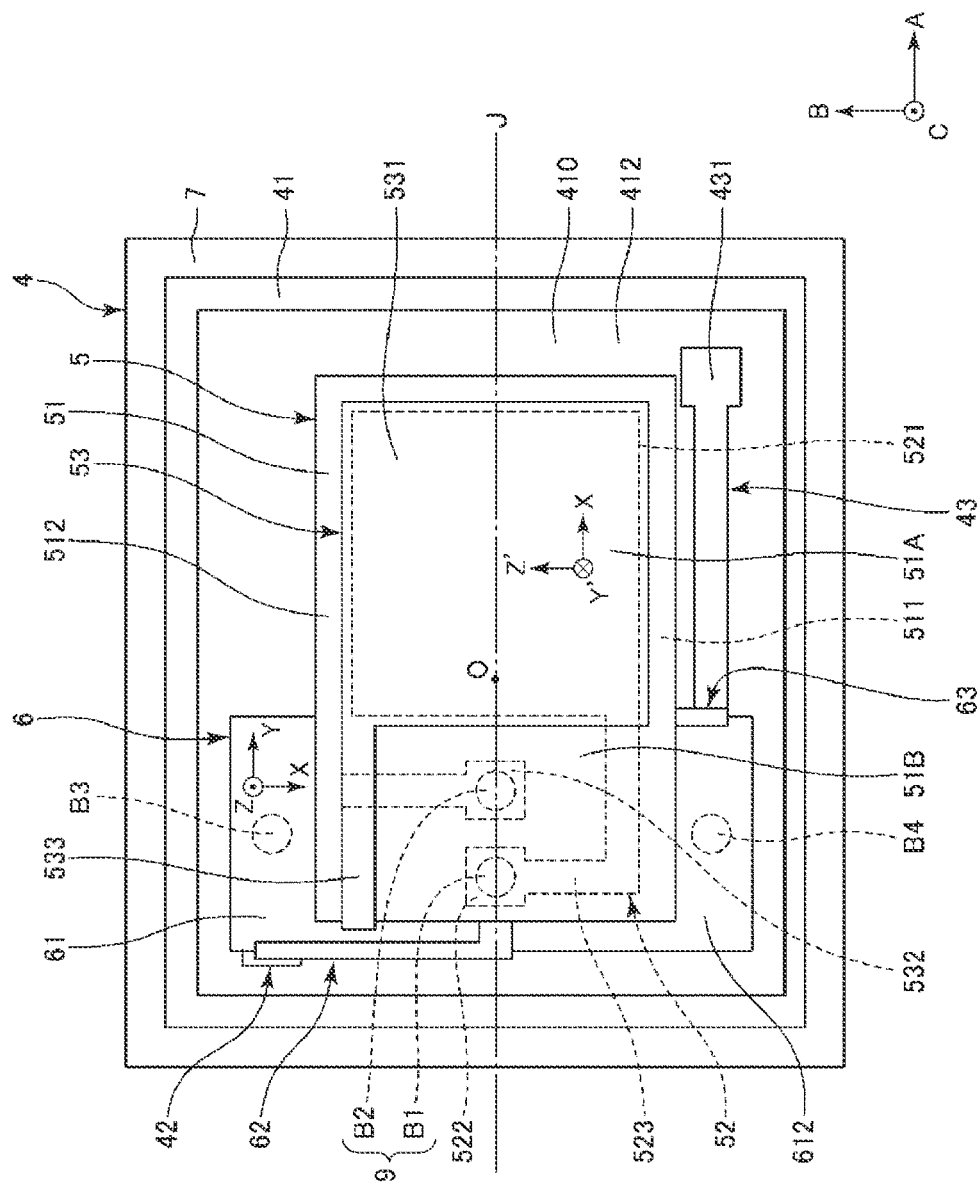
FIG. 8 is a plan view showing a modified example of the relay substrate.
Figure 9:
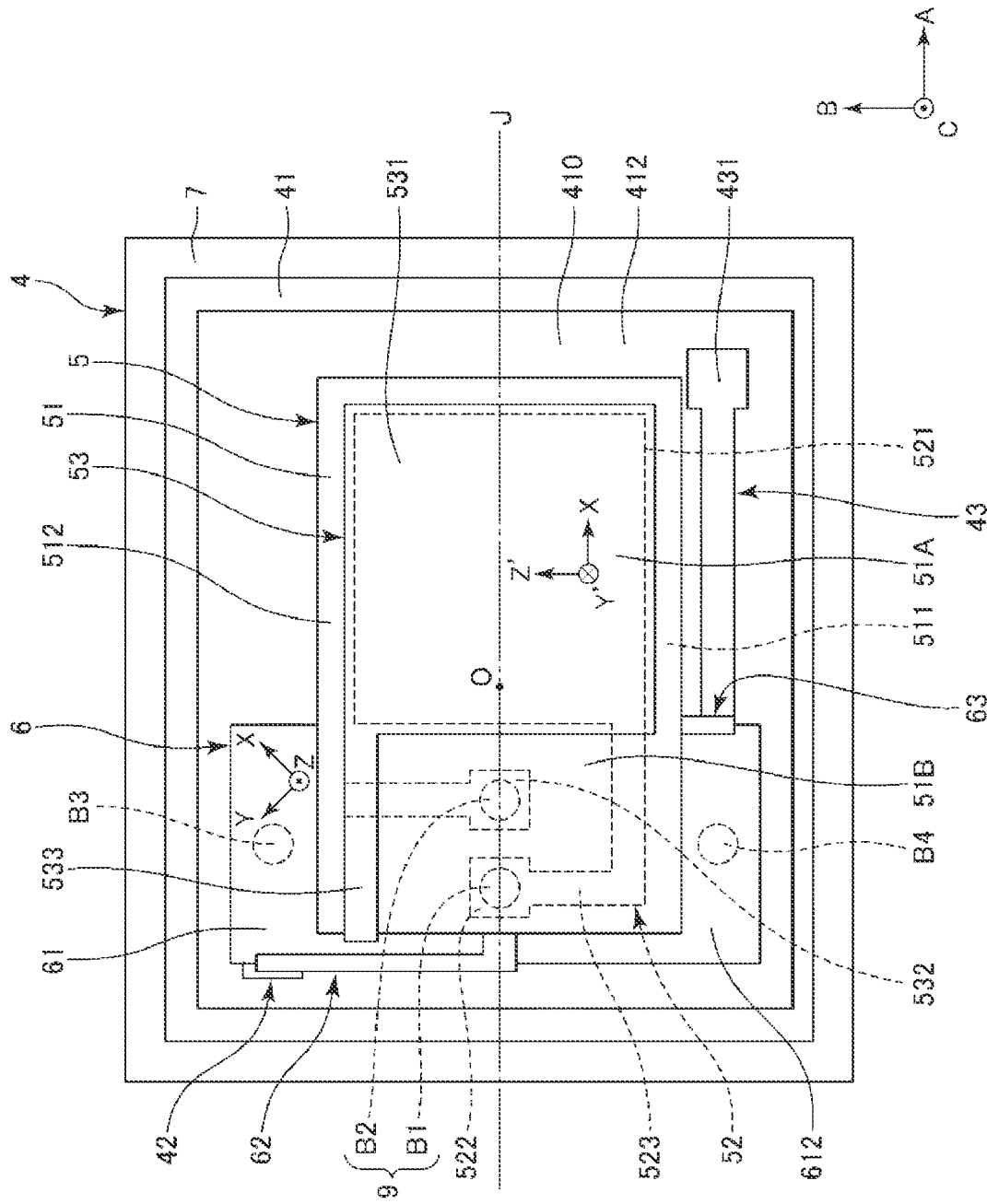
FIG. 9 is a plan view showing a modified example of the relay substrate.
Figure 10:
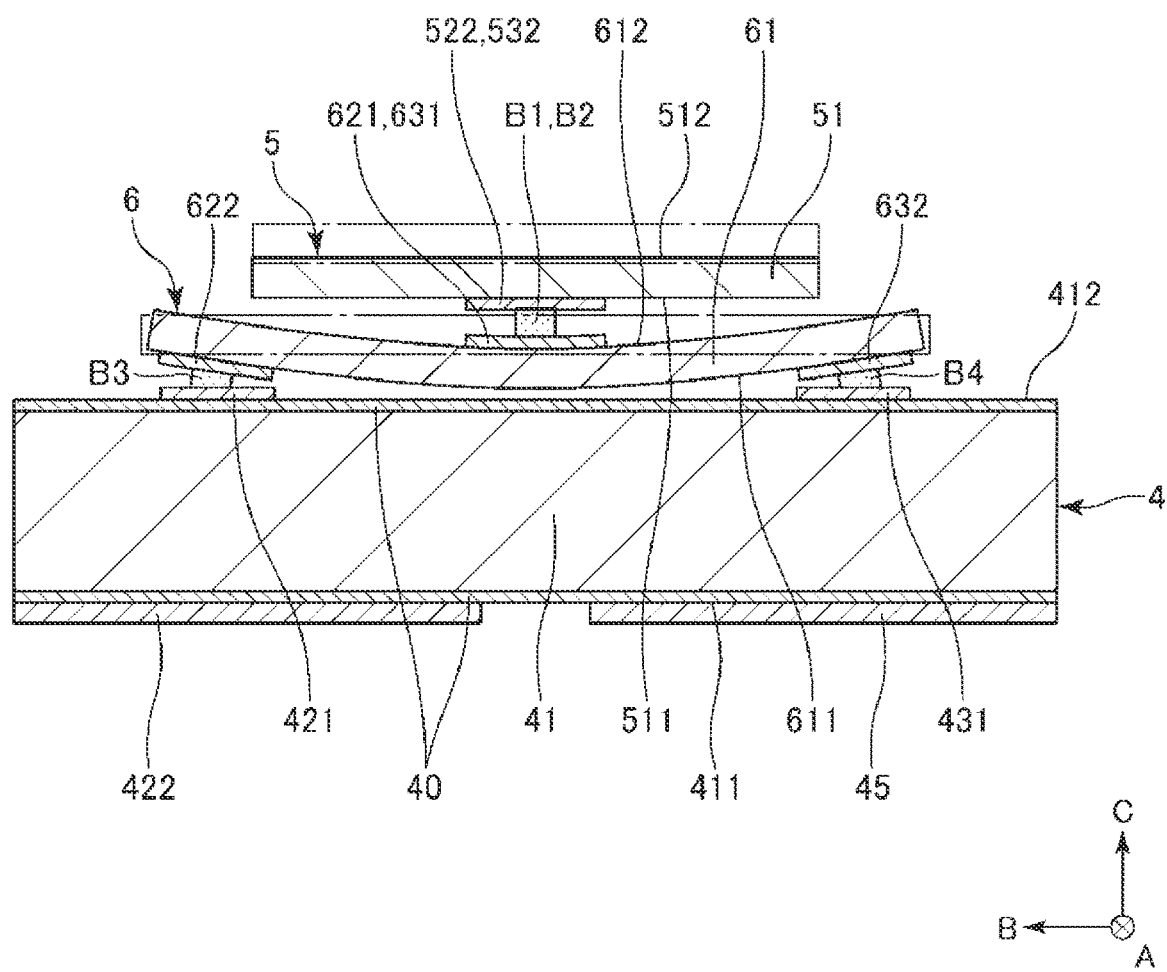
FIG. 10 is a cross-sectional view showing a state in which a curvature deformation occurs in the relay substrate.
Figure 11:
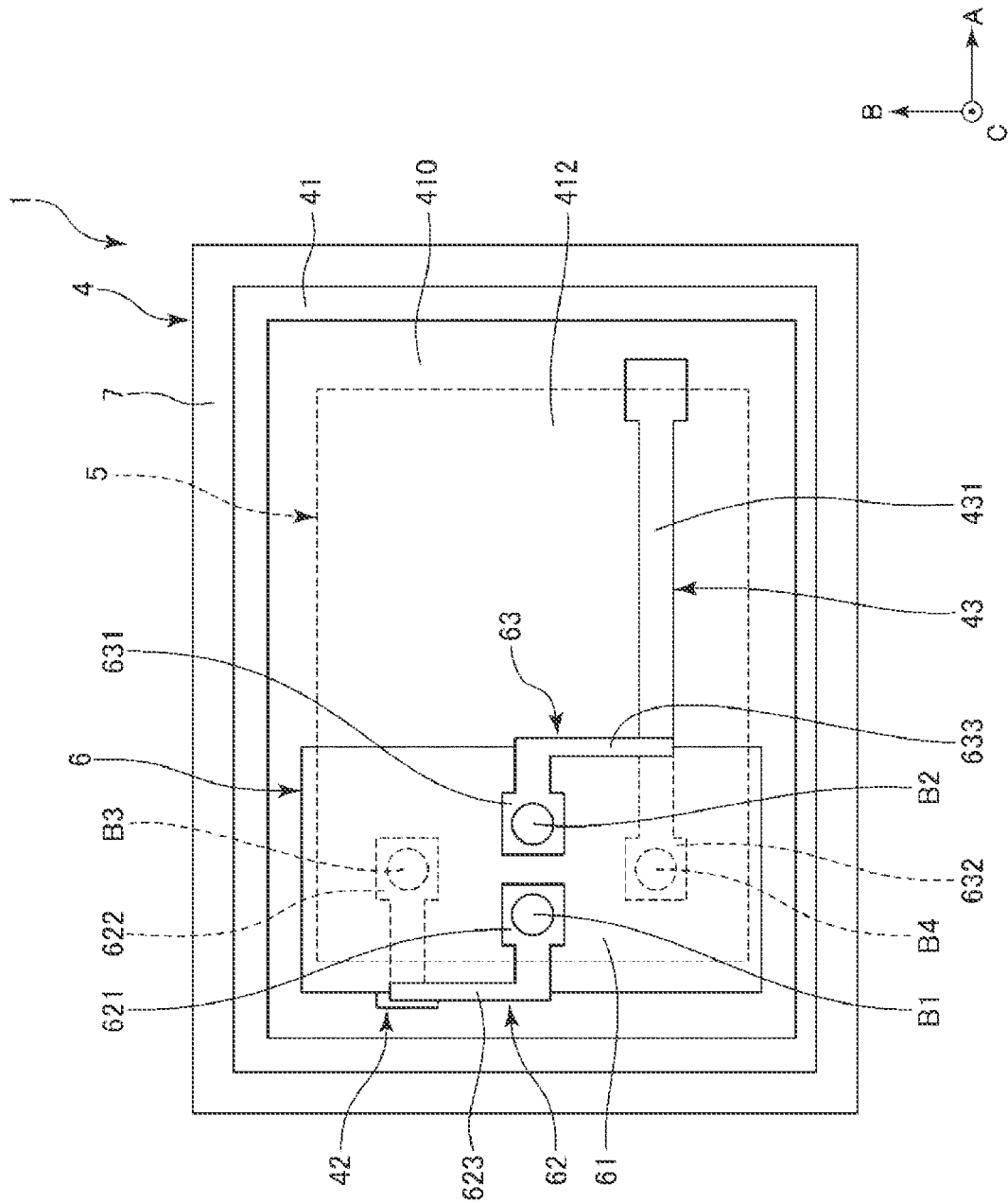
FIG. 11 is a plan view showing a modified example of the relay substrate.

FIG. 1 is an exploded perspective view of a vibrator device according to a first embodiment of the present disclosure. FIG. 2 is a cross-sectional view of the vibrator device shown in FIG. 1. FIG. 3 is a plan view showing a base. FIG. 4 is a cross-sectional view along the line W-W in FIG. 3. FIG. 5 is a plan view showing a relay substrate. FIG. 6 is a diagram showing a cutting angle of AT cut. FIG. 7 is a plan view showing a vibrator element. FIG. 8 and FIG. 9 are each a plan view showing a modified example of the relay substrate. FIG. 10 is a cross-sectional view showing a state in which a curvature deformation occurs in the relay substrate. FIG. 11 is a plan view showing a modified example of the relay substrate. It should be noted that in each of the drawings, there are illustrated an A axis, a B axis, and a C axis perpendicular to each other for the sake of convenience of explanation. Further, the tip side of the arrow of each of the axes is also referred to as a "positive side," and the base end side is also referred to as a "negative side." Further, the positive side of the C axis is also referred to as an "upper side," and the negative side thereof is also referred to as a "lower side." Further, the plan view from a direction along the C axis is also referred to simply as a "plan view."

As shown in FIG. 1, the vibrator device 1 has a base 4, a relay substrate 6 bonded to an upper surface of the base 4 via a base-side bonding member 8, a vibrator element 5 bonded to an upper surface of the relay substrate 6 via an element-side bonding member 9, and a lid 3 bonded to the upper surface of the base 4 via a bonding member 7 so as to cover the relay substrate 6 and the vibrator element 5. In such a vibrator device 1, as shown in FIG. 2, the base 4 and the lid 3 form a housing space S for housing the relay substrate 6 and the vibrator element 5. The housing space S is airtightly sealed, and is set in a reduced-pressure state, and more preferably, in a state approximate to a vacuum state. Thus, the CI (crystal impedance) value of the vibrator element 5 decreases, and the oscillation characteristic is improved. It should be noted that the atmosphere in the housing space S is not particularly limited, but can also be, for example, in the atmospheric pressure state or a pressurized state.

As shown in FIG. 3 and FIG. 4, the base 4 has a substrate 41, and a first substrate interconnection 42 and a second substrate interconnection 43 disposed on the substrate 41. Further, the substrate 41 is a thin plate, and has a lower surface 411 and an upper surface 412 having an obverse-reverse relationship with each other. Further, the substrate 41 has two through holes 413, 414 which penetrate the lower surface 411 and the upper surface 412. Further, a planar shape of the substrate 41 is a rectangular shape.

The substrate 41 is a semiconductor substrate. The semiconductor substrate is not particularly limited, and it is possible to use, for example, a silicon substrate, a germanium substrate, or a compound semiconductor substrate made of GaP, GaAs, InP, or the like. By using the semiconductor substrate as the substrate 41, it is possible to form the vibrator device 1 with a semiconductor process. Therefore, it is possible to accurately manufacture the vibrator device 1, and at the same time, it is possible to achieve reduction in size of the vibrator device 1. Further, by doping the substrate 41 with impurities such as phosphorus (P) or boron (B) to form a plurality of active elements, and then electrically coupling the active elements to each other, it is possible to provide the substrate 41 with, for example, a semiconductor circuit including an oscillation circuit. In such a manner as described above, it is possible to effectively use a space of the substrate 41. In the present embodiment, a silicon substrate is used as the substrate 41. Thus, there is obtained the substrate 41 which is easily available, low in price, and easy to work.

It should be noted that in order to ensure the insulation property of the substrate 41, an insulating film 410 is formed on a surface of the substrate 41. The insulating film 410 is formed of a silicon oxide film ($SiO_2$ film). The method of forming the insulating film 410 is not particularly limited, and the insulating film 410 can be formed by, for example, thermally oxidizing the surface of the substrate 41, or can also be formed by plasma CVD using TEOS (tetraethoxysilane). It should be noted that the insulating film 410 is not particularly limited, but can be formed of insulating resin material such as polyimide, or can be formed of a complex obtained by stacking materials different in type from each other.

It should be noted that the substrate 41 is not limited to the semiconductor substrate, and it is also possible to use, for example, a ceramic substrate or a glass substrate.

Further, the first substrate interconnection 42 has an internal terminal 421 which is disposed on the upper surface 412, and is exposed to the inside of the housing space S, an external terminal 422 disposed on the lower surface 411, and a through electrode 423 which is disposed inside the through hole 413, and electrically couples the internal terminal 421 and the external terminal 422 to each other. Similarly, the second substrate interconnection 43 has an internal terminal 431 which is disposed on the upper surface 412, and is exposed to the inside of the housing space S, an external terminal 432 disposed on the lower surface 411, and a through electrode 433 which is disposed inside the through hole 414, and electrically couples the internal terminal 431 and the external terminal 432 to each other.

It should be noted that in the present embodiment, on the lower surface 411, there are further disposed two dummy terminals 44, 45. The dummy terminals 44, 45 do not assume an electrical role, but are provided in order to, for example, increase bonding strength with an object. It should be noted that the role of the dummy terminals 44, 45 is not limited thereto. Further, the dummy terminals 44, 45 can be eliminated.

As shown in FIG. 2, the lid 3 has a recessed part 32 which has a bottom and opens on the lower surface. The lid 3 is bonded to the base 4 in the state of housing the relay substrate 6 and the vibrator element 5 in the recessed part 32. The lid 3 is a semiconductor substrate. The semiconductor substrate is not particularly limited, and it is possible to use, for example, a silicon substrate, a germanium substrate, or a compound semiconductor substrate made of GaP, GaAs, InP, or the like. By using the semiconductor substrate as the lid 3, it is possible to form the vibrator device 1 with the semiconductor process, and therefore, the vibrator device 1 can accurately be manufactured, and at the same time, it is possible to achieve reduction in size thereof.

In particular, in the present embodiment, a silicon substrate is used as the lid 3. Thus, there is obtained the lid 3 which is easily available, low in price, and easy to work. Further, it is possible to make the material of the substrate 41 and the material of the lid 3 the same as each other, and thus it is possible to make the substrate 41 and the lid 3 equal in thermal expansion coefficient to each other. Therefore, it is possible to prevent the stress caused by thermal expansion from being generated and further from increasing or decreasing, and thus, there is obtained the vibrator device 1 having excellent vibration characteristics.

It should be noted that the lid 3 is not particularly limited, and it is also possible to use, for example, a ceramic substrate or a glass substrate. Further, as the lid 3, there can be used a substrate different in type from the substrate 41. In particular, when the glass substrate having a light transmissive property is used as the lid 3, it is possible to perform a frequency adjustment of the vibrator element 5 by irradiating the vibrator element 5 with laser via the lid 3 to partially remove an excitation electrode after manufacturing the vibrator device 1.

Such a lid 3 is bonded directly to the base 4 via the bonding member 7. In the present embodiment, the lid 3 and the base 4 are bonded to each other using diffusion bonding which is included in the direct bonding, and uses mutual diffusion of metals. It should be noted that the bonding method is not limited thereto, and it is possible to, for example, irradiate the bonding surfaces of the lid 3 and the base 4 with an inert gas such as argon gas to activate the bonding surfaces, and then bond the bonding surfaces directly to each other. Further, it is possible to bond the lid 3 and the base 4 to each other using a variety of types of bonding material such as a resin adhesive or low-melting-point glass.

As shown in FIG. 1 and FIG. 2, the relay substrate 6 is disposed above the base 4 at a distance from the base 4. Further, the relay substrate 6 has a second quartz crystal substrate 61 made of Z-cut quartz crystal, and a pair of interconnections 62, 63 provided to the second quartz crystal substrate 61. The second quartz crystal substrate 61 made of Z-cut quartz crystal will briefly be described. Quartz crystal has crystal axes X, Y, and Z perpendicular to each other. The X axis, the Y axis, and the Z axis are called an electrical axis, a mechanical axis, and an optical axis, respectively. Further, the second quartz crystal substrate 61 is a "Z-cut quartz crystal substrate" carved out along the X-Y plane. In other words, the second quartz crystal substrate 61 has a thickness in the Z-axis direction, and spread in the X-Y plane direction.

The second quartz crystal substrate 61 is a thin plate, and has a lower surface 611 as a fourth surface and an upper surface 612 as a third surface having an obverse-reverse relationship with each other. Further, the planar shape of the second quartz crystal substrate 61 is a rectangular shape. In particular, in the present embodiment, the planar shape is an oblong having long sides in a direction along the Y axis, and having short sides in a direction along the X axis. Further, the second quartz crystal substrate 61 is disposed so that a direction along the X axis coincides with a direction along the A axis, a direction along the Y axis coincides with a direction along the B axis, and a direction along the Z axis coincides with a direction along the C axis.

Further, as shown in FIG. 5, the interconnection 62 has a first relay interconnection 621 disposed on the upper surface 612, a third relay interconnection 622 disposed on the lower surface 611, and a coupling interconnection 623 which passes on a side surface to electrically couple the first relay interconnection 621 and the third relay interconnection 622 to each other. Similarly, the interconnection 63 has a second relay interconnection 631 disposed on the upper surface 612, a fourth relay interconnection 632 disposed on the lower surface 611, and a coupling interconnection 633 which passes on a side surface to electrically couple the second relay interconnection 631 and the fourth relay interconnection 632 to each other.

Further, the first relay interconnection 621 and the second relay interconnection 631 disposed on the upper surface 612 are arranged side by side in a direction along the A axis. Meanwhile, the third relay interconnection 622 and the fourth relay interconnection 632 disposed on the lower surface 611 are arranged side by side in a direction along the B axis. It should be noted that the configuration of the coupling interconnections 623, 633 is not particularly limited, and can include, for example, a through electrode penetrating the second quartz crystal substrate 61.

Such a relay substrate 6 is bonded to the upper surface 412 of the base 4 via the base-side bonding member 8. The base-side bonding member 8 has a third bonding member B3 and a fourth bonding member B4 disposed at a distance from each other. Further, as shown in FIG. 3 and FIG. 5, the third bonding member B3 has contact with the internal terminal 421 and the third relay interconnection 622 to electrically couple the first substrate interconnection 42 and the interconnection 62 to each other. Meanwhile, the fourth bonding member B4 has contact with the internal terminal 431 and the fourth relay interconnection 632 to electrically couple the second substrate interconnection 43 and the interconnection 63 to each other. It should be noted that the third bonding member B3 and the fourth bonding member B4 are arranged side by side in a direction along the B axis.

As shown in FIG. 1 and FIG. 2, the vibrator element 5 is disposed above the relay substrate 6 at a distance from the relay substrate 6. Further, the vibrator element 5 has a first quartz crystal substrate 51 made of AT-cut quartz crystal, and a pair of electrodes 52, 53 provided to the first quartz crystal substrate 51. The first quartz crystal substrate 51 made of AT-cut quartz crystal has the thickness-shear vibration mode, and has a third-order frequency-temperature characteristic. Therefore, the vibrator element 5 has an excellent temperature characteristic.

The AT cut will briefly be described. As described above, quartz crystal has the crystal axes X, Y, and Z perpendicular to each other. As shown in FIG. 6, the first quartz crystal substrate 51 is a "rotated Y-cut quartz crystal substrate" carved out along a plane obtained by rotating the X-Z plane around the X axis as much as a predetermined angle θ, and the substrate which is carved out along a plane obtained by the rotation as much as θ=35° 15' is called an "AT-cut quartz crystal substrate." It should be noted that the Y axis and the Z axis rotated around the X axis in accordance with the angle θ are hereinafter referred to as a Y' axis and a Z' axis, respectively. In other words, the first quartz crystal substrate 51 has a thickness in a direction along the Y' axis, and spread in the X-Z' plane direction.

As shown in FIG. 2, the first quartz crystal substrate 51 is a thin plate, and has a lower surface 511 as a first surface and an upper surface 512 as a second surface having an obverse-reverse relationship with each other. Further, as shown in FIG. 1 and FIG. 7, the planar shape of the first quartz crystal substrate 51 is a rectangular shape. In particular, in the present embodiment, the planar shape is an oblong having long sides in a direction along the X axis, and having short sides in a direction along the Z' axis. Further, as shown in FIG. 7, the first quartz crystal substrate 51 has a vibrating part 51A vibrating in the thickness-shear mode, and a support part 51B which is located around the vibrating part 51A and is integrated with the vibrating part 51A. The first quartz crystal substrate 51 in the present embodiment is a flat type substrate in which the vibrating part 51A and the support part 51B have the same thickness. Further, the first quartz crystal substrate 51 is disposed so that a direction along the X axis coincides with a direction along the A axis, a direction along the Z' axis coincides with a direction along the B axis, and a direction along the Y' axis coincides with a direction along the C axis.

The electrode 52 has a first excitation electrode 521, a first terminal 522, and a first coupling interconnection 523, wherein the first excitation electrode 521 is disposed on the lower surface 511 of the vibrating part 51A, the first terminal 522 is disposed on the lower surface 511 of the support part 51B, and the first coupling interconnection 523 electrically couples the first excitation electrode 521 and the first terminal 522 to each other. Further, the electrode 53 has a second excitation electrode 531, a second terminal 532, and a second coupling interconnection 533, wherein the second excitation electrode 531 is disposed on the upper surface 512 of the vibrating part 51A so as to be opposed to the first excitation electrode 521, the second terminal 532 is disposed on the lower surface 511 of the support part 51B, and the second coupling interconnection 533 electrically couples the second excitation electrode 531 and the second terminal 532 to each other. Further, the first terminal 522 and the second terminal 532 are arranged side by side in a direction along the A axis.

It should be noted that the first quartz crystal substrate 51 is not limited thereto, and can be a mesa type substrate in which the vibrating part 51A is thicker than the support part 51B, or can also be an inverted-mesa type substrate in which the vibrating part 51A is thinner than the support part 51B. Further, it is also possible to perform a bevel treatment for grinding the periphery of the first quartz crystal substrate 51 to thereby chamfer the first quartz crystal substrate 51, or a convex treatment for changing the upper surface and the lower surface to a convex surface. Further, in the case of the mesa type substrate, it is possible to adopt a configuration in which the vibrating part 51A projects from only either one of the lower surface 511 and the upper surface 512, and in the case of the inverted-mesa type substrate, it is possible to adopt a configuration in which the vibrating part 51A is recessed from only either one of the lower surface 511 and the upper surface 512.

Such a vibrator element 5 is bonded to the upper surface 612 of the relay substrate 6 via the element-side bonding member 9. The element-side bonding member 9 has a first bonding member B1 and a second bonding member B2 disposed at a distance from each other. Further, the first bonding member B1 has contact with the first terminal 522 and the first relay interconnection 621 to electrically couple the electrode 52 and the interconnection 62 to each other. Meanwhile, the second bonding member B2 has contact with the second terminal 532 and the second relay interconnection 631 to electrically couple the electrode 53 and the interconnection 63 to each other.

Further, the first bonding member B1 and the second bonding member B2 are arranged side by side in a direction along the A axis. Further, in the plan view, when an axis crossing the center O of the first quartz crystal substrate 51 and extending along the A axis is assumed as an imaginary line J, the first bonding member B1 and the second bonding member B2 are arranged on the imaginary line J. Thus, it is possible to support the vibrator element 5 in a balanced manner with the element-side bonding member 9.

The first bonding members B1, the second bonding member B2, the third bonding member B3, and the fourth bonding member B4 are not particularly limited as long as both of the electrical conductivity and the bonding property are provided, and it is possible to use, for example, a variety of metal bumps such as a gold bump, a silver bump, a copper bump, a nickel bump, or a solder bump, or an electrically conductive adhesive having an electrically conductive filler such as a silver filler dispersed in a variety of adhesives such as a polyimide type adhesive, an epoxy type adhesive, a silicone type adhesive, or an acrylic adhesive. It should be noted that it is preferable for the first, second, third, and fourth bonding members B1, B2, B3, and B4 to be a metal bump. Thus, wetting spread, which may occur in the case of electrically-conductive adhesives, does not occur, and therefore, it is possible to achieve reduction in size of the first, second, third, and fourth bonding members B1, B2, B3, and B4 compared to electrically-conductive adhesives. Further, it is possible to prevent a gas from occurring from the first, second, third, and fourth bonding members B1, B2, B3, and B4, and it is possible to effectively prevent an environmental variation of the housing space S, and in particular, a rise in pressure. Further, it is possible to exert higher bonding strength compared to electrically-conductive adhesives.

Further, as the first, second, third, and fourth bonding members B1, B2, B3, and B4, among the metal bumps, any of a gold bump, a nickel bump, and a copper bump is preferably used, and a gold bump is more preferably used. In the present embodiment, gold bumps are used as the first, second, third, and fourth bonding members B1, B2, B3, and B4. By using any of gold bumps, nickel bumps, and copper bumps, in particular gold bumps among these bumps, as the first, second, third, and fourth bonding members B1, B2, B3, and B4 as described above, a difference in linear expansion coefficient between the first, second, third, and fourth bonding members B1, B2, B3, and B4 and the first and second quartz crystal substrates 51, 61 can be made sufficiently small, and it is possible to effectively prevent the stress caused by the difference in linear expansion coefficient from occurring.

It should be noted that the gold bump is a bump formed of gold (Au), the nickel bump is a bump formed of nickel (Ni), and the copper bump is a bump formed of copper (Cu). Further, the gold bump can substantially be formed only of gold (Au), or can also include a metal material other than gold (Au), a variety of types of additive agent, and so on in addition to gold (Au). The same applies to the nickel bump and the copper bump.

Hereinabove, the components of the vibrator device are briefly described. In such a vibrator device 1, innovations are applied to the materials, orientations, arrangement, and so on of the components, and therefore, a stress is difficult to occur, and the stress having occurred is difficult to be transferred to the vibrator element 5. Therefore, it is possible for the vibrator device 1 to exert excellent vibration characteristics.

This point will hereinafter be described. As described above, in the vibrator device 1, the vibrator element 5 is bonded on the relay substrate 6. Further, the relay substrate 6 is formed of quartz crystal which is the same material as the material of the vibrator element 5. When forming the relay substrate 6 of the same material as the material of the vibrator element 5, the relay substrate 6 and the vibrator element 5 become the same in linear expansion coefficient, and it is conceivable that a stress caused by a difference in linear expansion coefficient does not occur between the relay substrate 6 and the vibrator element 5. However, quartz crystal has a characteristic that the linear expansion coefficient is different by orientation, and therefore, it is not achievable to make the relay substrate 6 and the vibrator element 5 the same in linear expansion coefficient simply by forming the relay substrate 6 from quartz crystal, namely the same material as the material of the vibrator element 5. It should be noted that the linear expansion coefficient of quartz crystal is 13.7 ppm/° C. in each of a direction along the X axis and a direction along the Y axis, and is 9.7 ppm/° C. in a direction along the Z axis.

Therefore, in the vibrator device 1, as shown in FIG. 7, the X axis of the first quartz crystal substrate 51 of the vibrator element 5 and the X axis of the second quartz crystal substrate 61 of the relay substrate 6 are made to coincide with the A axis as the arrangement direction of the first bonding member B1 and the second bonding member B2 for bonding the first quartz crystal substrate 51 and the second quartz crystal substrate 61 to each other. In other words, the direction of the X axis of the first quartz crystal substrate 51 of the vibrator element 5, the direction of the X axis of the second quartz crystal substrate 61 of the relay substrate 6, and the arrangement direction of the first and second bonding members B1, B2 are aligned with each other. By adopting such a configuration, it is possible to make the relay substrate 6 and the vibrator element 5 equal in linear expansion coefficient in a direction along the A axis, and it becomes difficult for the stress due to a difference in thermal expansion coefficient to be applied to the vibrator element 5. Therefore, it is possible to effectively prevent the degradation of the vibration characteristics of the vibrator element 5.

It should be noted that in quartz crystal, the linear expansion coefficient in a direction along the X axis and the linear expansion coefficient in a direction along the Y axis are equal to each other as described above. In other words, the linear expansion coefficient is constant in any directions included in the X-Y plane direction. Therefore, for example, it is possible to adopt a configuration in which the Y axis of the second quartz crystal substrate 61 coincides with the A axis as shown in FIG. 8, or a configuration in which both of the X axis and the Y axis of the second quartz crystal substrate 61 are tilted with respect to the A axis as shown in FIG. 9. Even in these configurations, it is possible to exert substantially the same advantages as those of the present embodiment.

It should be noted that as described above, the relay substrate 6 is bonded to the base 7 via the third bonding member B3 and the fourth bonding member B4 arranged side by side in the B axis. The base 4 is formed mainly of silicon, and the linear expansion coefficient of silicon is 2.8 ppm/° C. In contrast, the linear expansion coefficient in a direction along the Y axis which coincides with a direction along the B axis of the relay substrate 6 is 13.7 ppm/° C. Since the linear expansion coefficient in a direction along the B axis is significantly different between the base 4 and the relay substrate 6 as described above, the stress in a direction along the B axis due to the difference in linear expansion coefficient occurs between the base 4 and the relay substrate 6, and as shown in FIG. 10, a curvature deformation having a substantially arc-like shape centering on the A axis occurs in the relay substrate 6.

Therefore, in order to make it difficult for the stress caused by the curvature deformation of the relay substrate 6 due to the difference in linear expansion coefficient from the base 4 to reach the vibrator element 5, the arrangement direction of the first and second bonding members B1, B2 is aligned with a direction along the A axis perpendicular to a direction along the B axis which is the direction of the curvature deformation. In other words, in the plan view, the first and second bonding members B1, B2 are arranged side by side in a direction crossing, in particular perpendicular to, the arrangement direction of the third and fourth bonding members B3, B4. Therefore, it is possible to suppress a variation in relative positional relationship between the first and second bonding members B1, B2 due to the curvature deformation of the relay substrate 6, and it becomes difficult for the stress caused in accordance with the curvature deformation of the relay substrate 6 to be applied to the vibrator element 5. In particular, by making the arrangement direction of the first and second bonding members B1, B2 and the arrangement direction of the third and fourth bonding members B3, B4 perpendicular to each other as in the present embodiment, the relative positional relationship between the first and second bonding members B1, B2 can be kept constant irrespective of the state of the relay substrate 6, namely regardless of whether or not the curvature deformation has occurred. Therefore, it becomes more difficult for the stress caused in accordance with the curvature deformation of the relay substrate 6 to be applied to the vibrator element 5.

It should be noted that this is not a limitation, and for example, the first and second bonding members B1, B2 can be arranged side by side in a direction crossing at an angle other than the right angle with respect to a direction along the B axis as the arrangement direction of the third and fourth bonding members B3, B4, or can also be arranged side by side in a direction along the B axis as the arrangement direction of the third and fourth bonding members B3, B4.

Further, as shown in FIG. 5, in the plan view, defining a line segment connecting the centers of the first and second bonding members B1, B2 as a line segment L1, and a line segment connecting the centers of the third and fourth bonding members B3, B4 as a line segment L2, the line segment L1 is a perpendicular bisector of the line segment L2. Thus, it is possible to dispose the first and second bonding members B1, B2 at the portions each forming an inflection point of the curvature deformation of the relay substrate 6 as shown in FIG. 10. Therefore, it is possible to suppress the tilt around the A axis of the first and second bonding members B1, B2 due to the curvature deformation of the relay substrate 6. Therefore, the attitude of the vibrator element 5 is stabilized, and thus, it is possible to prevent the vibrator element 5 from making contact with the relay substrate 6 and the base 4.

It should be noted that in the present embodiment, the third and fourth bonding members B3, B4 are arranged so as not to overlap the vibrator element 5 in the plan view. Specifically, the third bonding member B3 is located at the positive side in the B-axis direction with respect to the vibrator element 5, and the fourth bonding member B4 is located at the negative side along the B-axis direction with respect to the vibrator element 5. Thus, it is possible to sufficiently separate the third and fourth bonding members B3, B4 from each other, and thus, it is possible to more stably support the relay substrate 6. It should be noted that this is not a limitation, and it is possible for the third and fourth bonding members B3, B4 to be disposed so as to overlap the vibrator element 5 as shown in FIG. 11, for example. Thus, it is possible to shorten the length in the B-axis direction of the relay substrate 6 compared to the present embodiment, and therefore, it is possible to achieve the reduction in size of the vibrator device 1.

Further, the first, second, third, and fourth bonding members B1, B2, B3, and B4 are each a gold bump. The linear expansion coefficient of gold (Au) as a constituent material of the gold bump is 14.3 ppm/° C. Therefore, the difference in linear expansion coefficient between the first and second bonding members B1, B2 and the first and second quartz crystal substrates 51, 61 can be suppressed to a sufficiently low level. As a result, a thermal stress generated in the interface between the first and second bonding members B1, B2 and the vibrator element 5, a thermal stress generated in the interface between the first and second bonding members B1, B2 and the relay substrate 6, and a thermal stress generated in the interface between the third and fourth bonding members B3, B4 and the relay substrate 6 can each be suppressed to a sufficiently low level. Therefore, there is obtained the vibrator device 1 in which a stress is difficult to be generated, and moreover, the stress generated is difficult to reach the vibrator element 5. It should be noted that the linear expansion coefficient of copper (Cu) as a constituent material of the copper bump which is cited as an alternative as preferable as the gold bump is 16.8 ppm/° C., and the linear expansion coefficient of nickel (Ni) as a constituent material of the nickel bump is 12.8 ppm/° C. Therefore, by adopting these configurations, it is possible to sufficiently exert the advantages described above although the advantages are slightly inferior to those of the gold bump.

The vibrator device 1 is hereinabove described. As described above, such a vibrator device 1 has the vibrator element 5 provided with the first quartz crystal substrate 51, the first excitation electrode 521, the second excitation electrode 531, the first terminal 522, and the second terminal 532, wherein the first quartz crystal substrate 51 includes the lower surface 511 as the first surface along the X axis as the electrical axis and the upper surface 512 as the second surface, the first surface and the second surface are in the obverse-reverse relationship, the first excitation electrode 521 is disposed on the lower surface 511, the second excitation electrode 531 is disposed on the upper surface 512 so as to be opposed to the first excitation electrode 521, the first terminal 522 and the second terminal 532 are disposed on the lower surface 511, the first terminal 522 is electrically coupled to the first excitation electrode 521, and the second terminal 532 is electrically coupled to the second excitation electrode 531, the base 4 provided with the substrate 41, the first substrate interconnection 42, and the second substrate interconnection 43, wherein the substrate 41 is located at the lower surface 511 side of the vibrator element 5, and the first substrate interconnection 42 and the second substrate interconnection 43 are disposed on the substrate 41, the relay substrate 6 provided with the second quartz crystal substrate 61, the first relay interconnection 621, the second relay interconnection 631, the third relay interconnection 622, and the fourth relay interconnection 631, wherein the second quartz crystal substrate 61 is disposed between the vibrator element 5 and the base 4, the thickness direction of the second quartz crystal substrate 61 is parallel to the Z axis as the optical axis, the first relay interconnection 621 and the second relay interconnection 631 are disposed on the upper surface 612 as the third surface at the vibrator element 5 side of the second quartz crystal substrate 61, the third relay interconnection 622 and the fourth relay interconnection 632 are disposed on the lower surface 611 which is the fourth surface on the base 4 side, and which has the obverse-reverse relationship with the upper surface 612, the third relay interconnection 622 is electrically coupled to the first relay interconnection 621, and the fourth relay interconnection 632 is electrically coupled to the second relay interconnection 631, the element-side bonding member 9 provided with the first bonding member B1 and the second bonding member B2, and configured to bond the vibrator element 5 and the relay substrate 6 to each other, wherein the first bonding member B1 electrically couples the first terminal 522 and the first relay interconnection 621 to each other, and the second bonding member B2 electrically couples the second terminal 532 and the second relay interconnection 631 to each other, and the base-side bonding member 8 provided with the third bonding member B3 and the fourth bonding member B4, and configured to bond the base 4 and the relay substrate 6 to each other, wherein the third bonding member B3 electrically couples the first substrate interconnection 42 and the third relay interconnection 622 to each other, and the fourth bonding member B4 electrically couples the second substrate interconnection 43 and the fourth relay interconnection 632 to each other. Further, the first bonding member B1 and the second bonding member B2 are arranged side by side in a direction along the X axis. By adopting such a configuration, it is possible to make the relay substrate and the vibrator element 5 equal in linear expansion coefficient along the arrangement direction of the first and second bonding members B1, B2. Therefore, it becomes difficult for the stress caused by the difference in thermal expansion coefficient to be applied to the vibrator element 5. As a result, it is possible to effectively prevent the degradation of the vibration characteristics of the vibrator element 5.

Further, as described above, the third bonding member B3 and the fourth bonding member B4 are arranged side by side in a direction crossing the arrangement direction of the first bonding member B1 and the second bonding member B2 in the plan view of the vibrator element 5. Thus, it is possible to suppress the change in relative positional relationship between the first and second bonding members B1, B2 due to the curvature deformation of the relay substrate 6 caused by the difference in linear expansion coefficient from the base 4. Therefore, it becomes difficult for the stress caused in accordance with the curvature deformation of the relay substrate 6 to be applied to the vibrator element 5.

Further, as described above, the third bonding member B3 and the fourth bonding member B4 are arranged side by side in a direction perpendicular to the arrangement direction of the first bonding member B1 and the second bonding member B2 in the plan view of the vibrator element 5. Thus, the relative positional relationship between the first and second bonding members B1, B2 can be kept constant irrespective of the state of the relay substrate 6, namely regardless of whether or not the curvature deformation has occurred. Therefore, it becomes more difficult for the stress caused in accordance with the curvature deformation of the relay substrate 6 to be applied to the vibrator element 5.

Further, as described above, the first bonding member B1, the second bonding member B2, the third bonding member B3, and the fourth bonding members B4 are each the gold bump. Thus, wetting spread, which may occur in the case of electrically-conductive adhesives, does not occur, and therefore, it is possible to achieve reduction in size of the first, second, third, and fourth bonding members B1, B2, B3, and B4 compared to electrically-conductive adhesives. Further, it is possible to prevent a gas from occurring from the first, second, third, and fourth bonding members B1, B2, B3, and B4, and it is possible to effectively prevent an environmental variation of the housing space S, and in particular, a rise in pressure. Further, it is possible to exert higher bonding strength compared to electrically-conductive adhesives.

Further, as described above, the metal bump constituting each of the first, second, third, and fourth bonding members B1, B2, B3, and B4 is the gold bump formed of gold (Au), the nickel bump formed of nickel (Ni), or the copper bump formed of copper (Cu). Thus, a thermal stress generated in the interface between the first and second bonding members B1, B2 and the vibrator element 5, a thermal stress generated in the interface between the first and second bonding members B1, B2 and the relay substrate 6, and a thermal stress generated in the interface between the third and fourth bonding members B3, B4 and the relay substrate 6 can each be suppressed to a sufficiently low level.

Further, as described above, the first bonding member B1 and the second bonding member B2 are arranged on the imaginary line J which crosses the center O of the first quartz crystal substrate 51 and is parallel to the X axis in the plan view of the vibrator element 5. Thus, it is possible to support the vibrator element 5 in a balanced manner.

Second Embodiment

Figure 12:
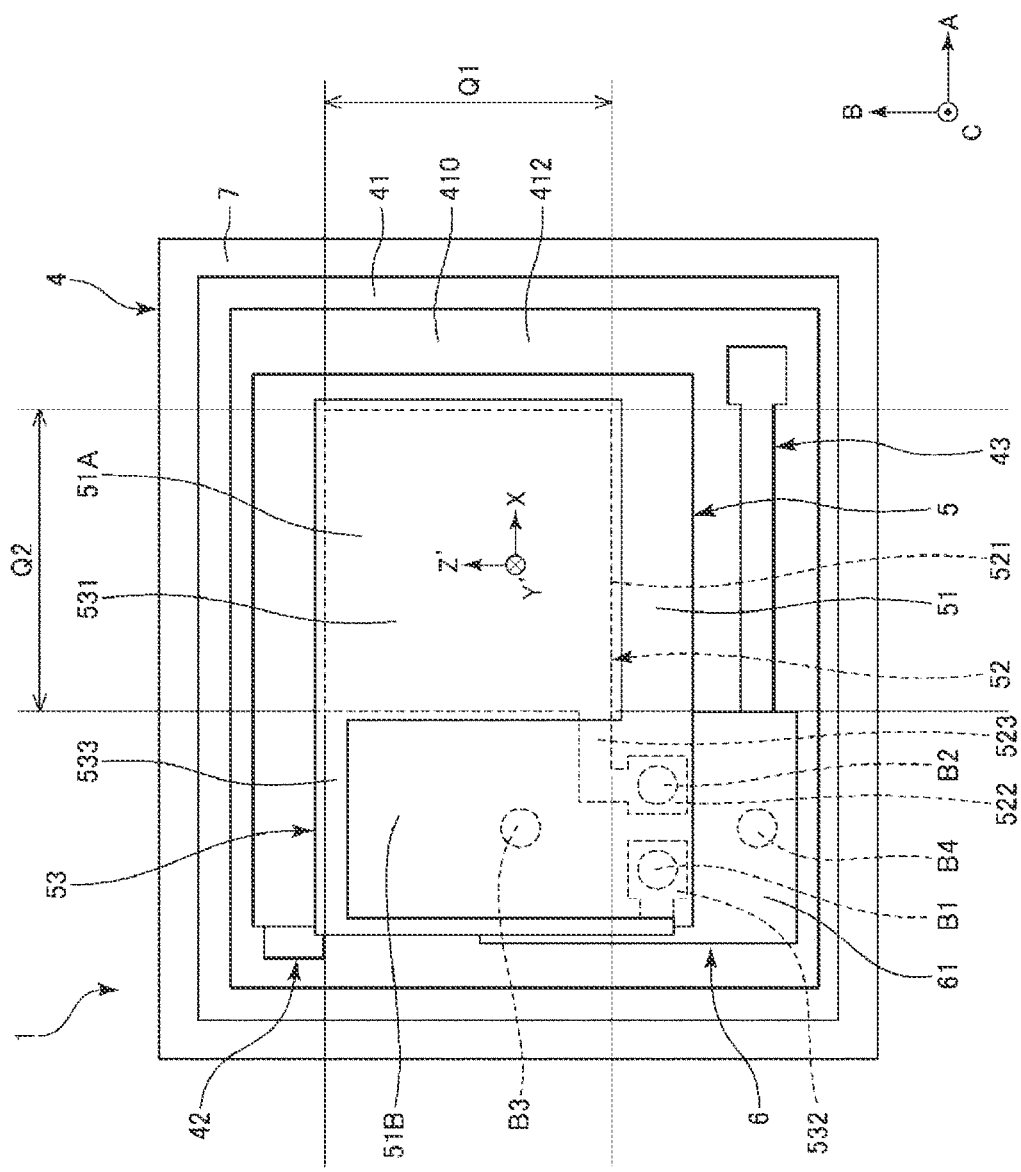
FIG. 12 is a plan view showing a vibrator device according to a second embodiment of the present disclosure.
Figure 13:
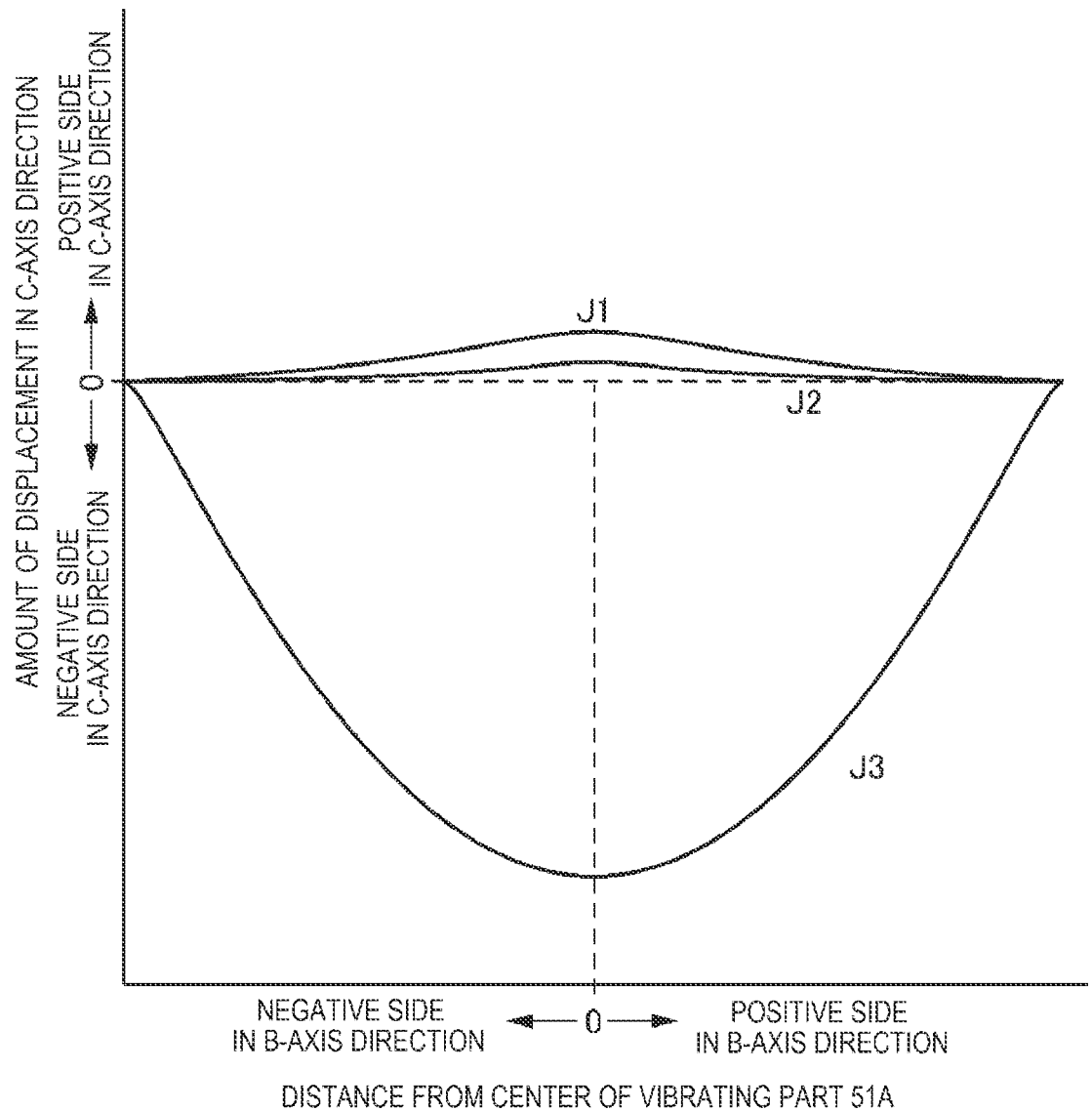
FIG. 13 is a graph showing an amount of displacement of a vibrating part.

FIG. 12 is a plan view showing a vibrator device according to a second embodiment of the present disclosure. FIG. 13 is a graph showing an amount of displacement of a vibrating part.

The vibrator device 1 according to the present embodiment is substantially the same as the vibrator device 1 according to the first embodiment described above except the point that the arrangement of the first and second bonding members B1, B2 is different. It should be noted that in the following description, the vibrator device 1 according to the second embodiment will be described with a focus on the difference from the first embodiment described above, and the description of substantially the same issues will be omitted. Further, in FIG. 12, the constituents substantially the same as in the embodiment described above are denoted by the same reference symbols.

As shown in FIG. 12, in the plan view, the first bonding member B1 and the second bonding member B2 are arranged along an outer edge of the vibrator element 5. Further, in the plan view, when an area obtained by extending the first excitation electrode 521 in a direction along the A axis, namely a direction along the X axis of the first quartz crystal substrate 51 is defined as a first area Q1, and an area obtained by extending the first excitation electrode 521 in a direction along the B axis perpendicular to a direction along the A axis, namely a direction along the Z' axis of the first quartz crystal substrate 51 is defined as a second area Q2, the first bonding member B1 and the second bonding member B2 are arranged so as not to overlap the first area Q1 and the second area Q2. Thus, it is possible to dispose the first bonding member B1 and the second bonding member B2 at a longer distance from the center of the vibrating part 51A of the vibrator element 5. Therefore, a propagation path of the stress from the first and second bonding members B1, B2 to the vibrating part 51A becomes longer, and it becomes difficult for the stress to be applied to the vibrating part 51A. As a result, it is possible to effectively prevent the degradation of the vibration characteristics of the vibrator element 5.

FIG. 13 shows a graph comparing the amount of displacement of the vibrating part 51A with respect to the first embodiment described above, the present embodiment, and the configuration in which the first and second bonding members B1, B2 are arranged side by side in the B-axis direction as a comparative example. In the drawing, the solid line J1 represents the first embodiment, the solid line J2 represents the present embodiment, and the solid line J3 represents the comparative example. It should be noted that the graph shows that the smaller the amount of displacement in a direction along the C axis is, the more difficult it is for the stress to be applied to the vibrating part 51A. As is understood from the drawing, it is possible to obtain the sufficient effect in the first embodiment described above over the comparative example, but according to the present embodiment, a further effect can be obtained.

According also to such a second embodiment as described above, there can be exerted substantially the same advantages as in the first embodiment described above.

Third Embodiment

Figure 14:
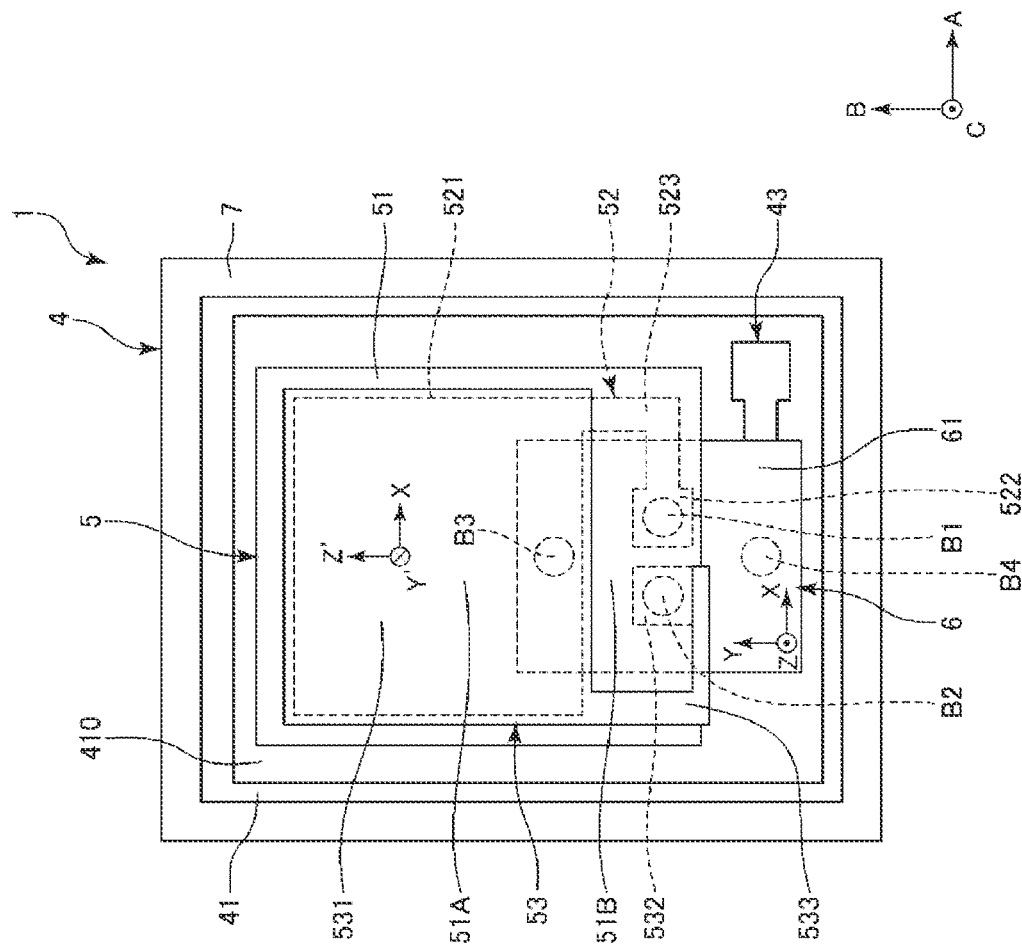
FIG. 14 is a plan view showing a vibrator device according to a third embodiment of the present disclosure.

FIG. 14 is a plan view showing a vibrator device according to a third embodiment of the present disclosure.

The vibrator device 1 according to the present embodiment is substantially the same as the vibrator device 1 according to the first embodiment described above except the point that the configuration of the vibrator element 5 is different. It should be noted that in the following description, the vibrator device 1 according to the third embodiment will be described with a focus on the difference from the first embodiment described above, and the description of substantially the same issues will be omitted. Further, in FIG. 14, the constituents substantially the same as in the embodiment described above are denoted by the same reference symbols.

As shown in FIG. 14, in the vibrator device 1 according to the present embodiment, the first terminal 522 and the second terminal 532 of the vibrator element 5 are located at the negative side in a direction along the B axis of the vibrating part 51A.

According also to such a third embodiment as described above, substantially the same advantages as in the first embodiment described above can be exerted.

Fourth Embodiment

Figure 15:
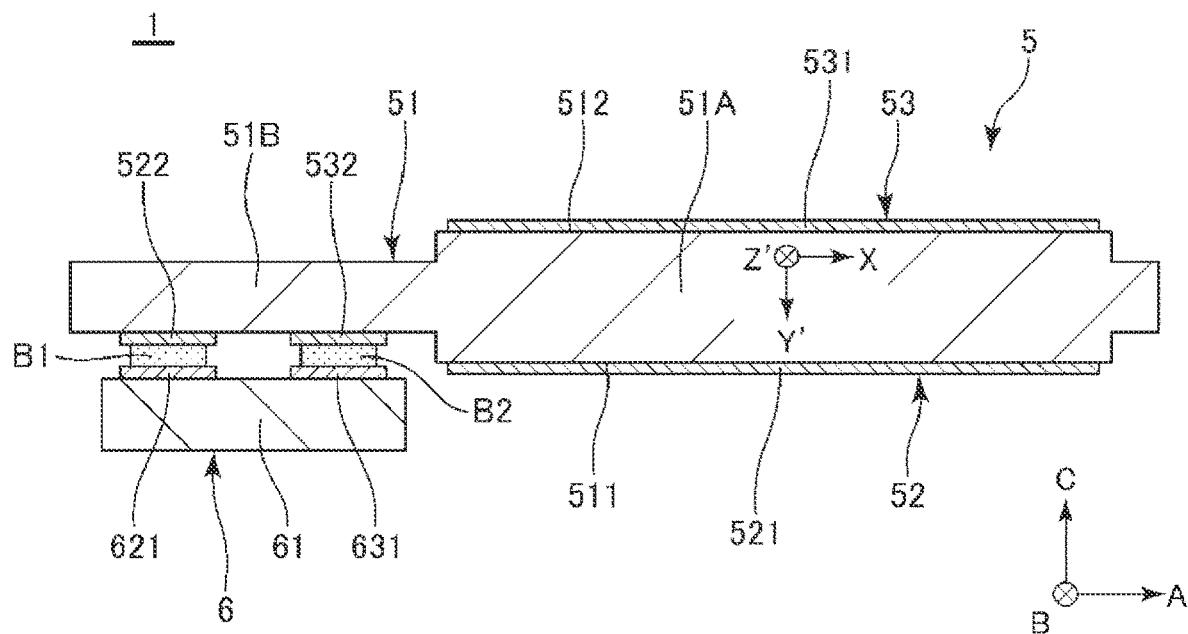
FIG. 15 is a cross-sectional view showing a vibrator element provided to a vibrator device according to a fourth embodiment of the present disclosure.

FIG. 15 is a cross-sectional view showing a vibrator element provided to a vibrator device according to a fourth embodiment of the present disclosure.

The vibrator device 1 according to the present embodiment is substantially the same as the vibrator device 1 according to the first embodiment described above except the point that the configuration of the vibrator element 5 is different. It should be noted that in the following description, the vibrator device 1 according to the fourth embodiment will be described with a focus on the difference from the first embodiment described above, and the description of substantially the same issues will be omitted. Further, in FIG. 15, the constituents substantially the same as in the embodiment described above are denoted by the same reference symbols.

As shown in FIG. 15, in the vibrator device 1 according to the present embodiment, the vibrator element 5 is of the mesa type. In other words, in the first quartz crystal substrate 51, the vibrating part 51A is thicker than the support part 51B. The vibrating part 51A projects toward the both sides in a direction along the Y' axis from the support part 51B. By adopting such a mesa type vibrator element 5, it is possible to effectively confine the thickness-shear vibration of the vibrating part 51A in the vibrating part 51A. Therefore, the vibration leakage of the vibrator element 5 can effectively be suppressed to obtain the vibrator element 5 having excellent vibration characteristics.

As described above, in the vibrator device 1 according to the present embodiment, the first quartz crystal substrate 51 has the vibrating part 51A in which the first excitation electrode 521 and the second excitation electrode 531 are disposed, and the support part 51B in which the first terminal 522 and the second terminal 532 are disposed, and which is thinner than the vibrating part 51A. Thus, the thickness-shear vibration can effectively be confined in the vibrating part 51A. Therefore, the vibration leakage of the vibrator element 5 can effectively be suppressed to obtain the vibrator element 5 having excellent vibration characteristics.

According also to such a fourth embodiment as described above, substantially the same advantages as in the first embodiment described above can be exerted.

Fifth Embodiment

Figure 16:
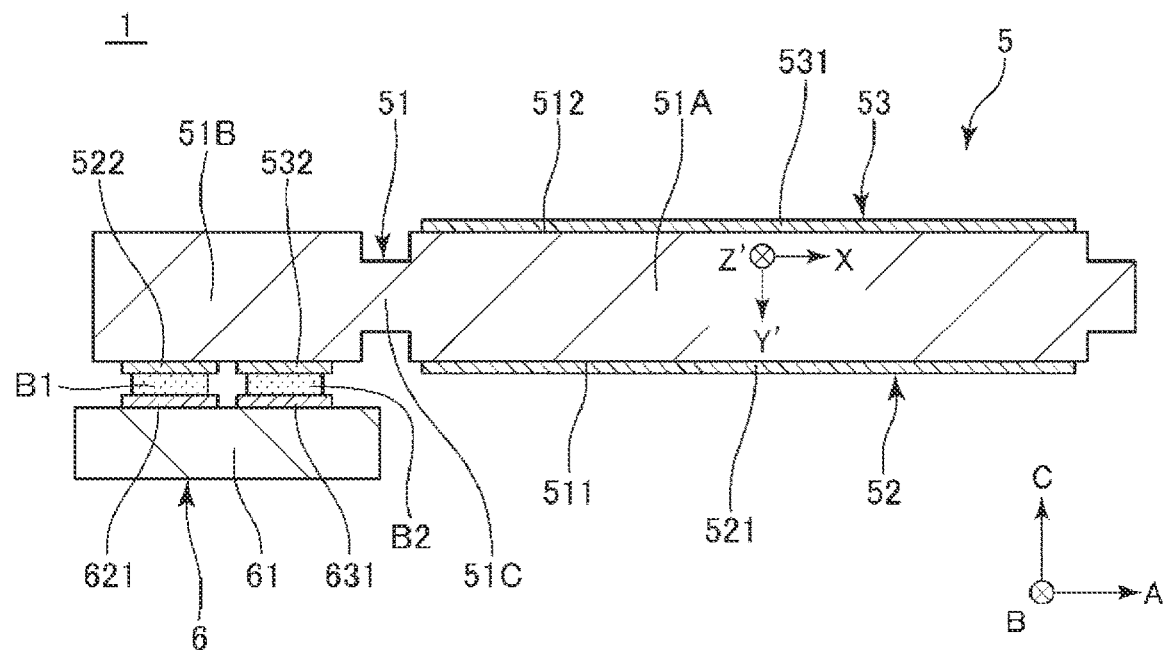
FIG. 16 is a cross-sectional view showing a vibrator element provided to a vibrator device according to a fifth embodiment of the present disclosure.

FIG. 16 is a cross-sectional view showing a vibrator element provided to a vibrator device according to a fifth embodiment of the present disclosure.

The vibrator device 1 according to the present embodiment is substantially the same as the vibrator device 1 according to the first embodiment described above except the point that the configuration of the vibrator element 5 is different. It should be noted that in the following description, the vibrator device 1 according to the fifth embodiment will be described with a focus on the difference from the first embodiment described above, and the description of substantially the same issues will be omitted. Further, in FIG. 16, the constituents substantially the same as in the embodiment described above are denoted by the same reference symbols.

As shown in FIG. 16, in the vibrator device 1 according to the present embodiment, there is adopted the mesa type vibrator element 5, and further, the first and second terminals 522, 532 are made thicker to project from the surroundings. In other words, the first quartz crystal substrate 51 has the vibrating part 51A, the support part 51B, and a coupling part 51C, wherein the first excitation electrode 521 and the second excitation electrode 531 are provided to the vibrating part 51A, the first terminal 522 and the second terminal 532 are provided to the support part 51B, the coupling part 51C is located between the vibrating part 51A and the support part 51B, and the coupling part 51C is thinner than the vibrating part 51A and the support part 51B. Thus, the thickness-shear vibration can effectively be confined in the vibrating part 51A similarly to the fourth embodiment described above. Further, since the support part 51B as a portion in which the first and second terminals 522, 532 are disposed, and which is bonded to the relay substrate 6 is made thicker, it is possible to increase the mechanical strength of the vibrator element 5.

According also to such a fifth embodiment as described above, substantially the same advantages as in the first embodiment described above can be exerted.

Sixth Embodiment

Figure 17:
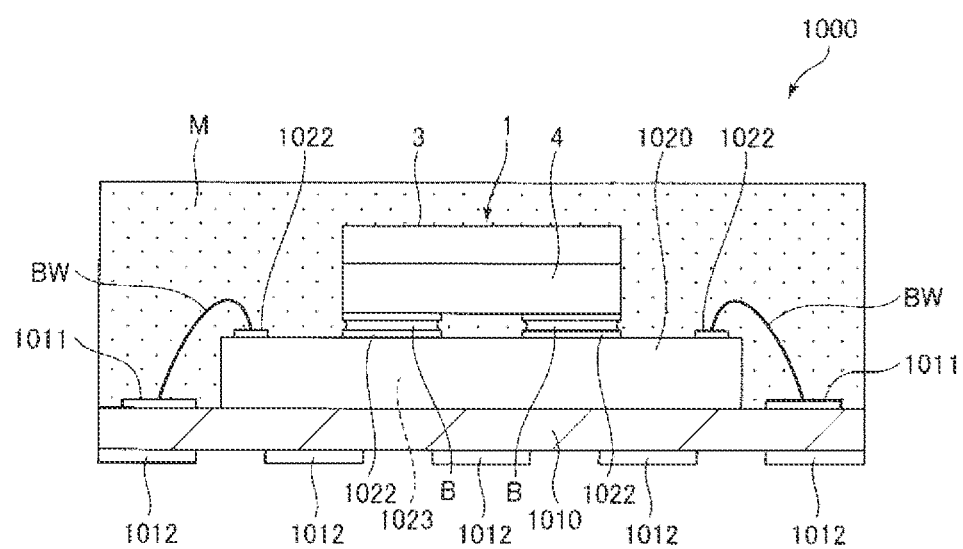
FIG. 17 is a cross-sectional view showing a vibrator module according to a sixth embodiment of the present disclosure.

FIG. 17 is a cross-sectional view showing a vibrator module according to a sixth embodiment of the present disclosure.

The vibrator module 1000 shown in FIG. 17 has a support substrate 1010, a circuit board 1020 mounted on the support substrate 1010, the vibrator device 1 mounted on the circuit board 1020, and a molding material M for molding the circuit board 1020 and the vibrator device 1.

The support substrate 1010 is, for example, an interposer substrate. On an upper surface of the support substrate 1010, there is disposed a plurality of coupling terminals 1011, and a plurality of mounting terminals 1012 is disposed on a lower surface thereof. Further, in the support substrate 1010, there are disposed internal interconnections not shown, and the coupling terminals 1011 are electrically coupled to the corresponding mounting terminals 1012 via the internal interconnections. The material of such a support substrate 1010 is not particularly limited, but there can be used, for example, a silicon substrate, a ceramic substrate, a resin substrate, a glass substrate, and a glass-epoxy substrate.

Further, the circuit board 1020 is bonded to the upper surface of the support substrate 1010 via a die attach material. In the circuit board 1020, there is formed an oscillation circuit 1023 for oscillating the vibrator element 5 provided to the vibrator device 1 to generate a frequency of a reference signal such as a clock signal, and a plurality of terminals 1022 electrically coupled to the oscillation circuit 1023 is disposed on an upper surface of the oscillation circuit 1023. Further, some of the terminals 1022 are electrically coupled to the coupling terminals 1011 via bonding wires BW, and some of the terminals 1022 are electrically coupled to the vibrator device 1 via an electrically-conductive bonding material B such as solder.

The molding material M molds the circuit board 1020 and the vibrator device 1 to protect them from moisture, dust, an impact, and so on. The molding material M is not particularly limited, but there can be used, for example, thermo-setting epoxy resin, and it is possible to form the mold using a transfer molding method.

Such a vibrator module 1000 as described above is provided with the vibrator device 1. Therefore, it is possible to appreciate the advantages of the vibrator device 1 described above, and excellent reliability can be exerted.

Although the vibrator device and the vibrator module according to the present disclosure are described based on the illustrated embodiments, the present disclosure is not limited to these embodiments, but the constituents of the components can be replaced with those having substantially the same functions and arbitrary configurations. Further, the present disclosure can also be added with any other constituents. Further, the present disclosure can be a combination of any two or more configurations of the embodiments described above.

What is claimed is:
1. A vibrator device comprising:
a vibrator element including a first quartz crystal substrate including a first surface and a second surface which are in an obverse-reverse relationship, and which extend along an X axis as an electrical axis, a first excitation electrode disposed on the first surface, a second excitation electrode disposed on the second surface so as to be opposed to the first excitation electrode, a first terminal which is disposed on the first surface, and which is electrically coupled to the first excitation electrode, and a second terminal which is disposed on the first surface, and which is electrically coupled to the second excitation electrode;
abase including a substrate located at the first surface side of the vibrator element, a first substrate interconnection provided to the substrate, and a second substrate interconnection provided to the substrate;

a relay substrate including a second quartz crystal substrate which is disposed between the vibrator element and the base, and a thickness direction of which is parallel to a Z axis as an optical axis, a first relay interconnection disposed on a third surface at the vibrator element side of the second quartz crystal substrate, a second relay interconnection disposed on the third surface, a third relay interconnection which is disposed on a fourth surface having an obverse-reverse relationship with the third surface and located on the base side, and which is electrically coupled to the first relay interconnection, and a fourth relay interconnection which is disposed on the fourth surface, and which is electrically coupled to the second relay interconnection;

an element-side bonding member which includes a first bonding member configured to electrically couple the first terminal and the first relay interconnection to each other, and a second bonding member configured to electrically couple the second terminal and the second relay interconnection to each other, and which is configured to bond the vibrator element and the relay substrate to each other; and a base-side bonding member which includes a third bonding member configured to electrically couple the first substrate interconnection and the third relay interconnection to each other, and a fourth bonding member configured to electrically couple the second substrate interconnection and the fourth relay interconnection to each other, and which is configured to bond the base and the relay substrate to each other, wherein the first bonding member and the second bonding member are arranged side by side in a direction along the X axis.

2. The vibrator device according to claim 1, wherein the third bonding member and the fourth bonding member are arranged side by side in a direction crossing an arrangement direction of the first bonding member and the second bonding member in a plan view of the vibrator element.

3. The vibrator device according to claim 2, wherein the third bonding member and the fourth bonding member are arranged side by side in a direction perpendicular to the arrangement direction of the first bonding member and the second bonding member in the plan view of the vibrator element.

4. The vibrator device according to claim 1, wherein the first bonding member, the second bonding member, the third bonding member, and the fourth bonding member are each a metal bump.

5. The vibrator device according to claim 4, wherein the metal bump is one of a gold bump formed of gold (Au), a nickel bump formed of nickel (Ni), and a copper bump formed of copper (Cu).

6. The vibrator device according to claim 1, wherein in a plan view of the vibrator element, an area obtained by extending the first excitation electrode in a direction along the X axis is defined as a first area, and an area obtained by extending the first excitation electrode in a direction perpendicular to the direction along the X axis is defined as a second area, the first bonding member and the second bonding member fail to overlap the first area and the second area.

7. The vibrator device according to claim 1, wherein the first bonding member and the second bonding member are disposed on an imaginary line which intersects with a center of the first quartz crystal substrate and is parallel to the X axis in a plan view of the vibrator element.

8. The vibrator device according to claim 1, wherein the first quartz crystal substrate includes
   a vibrating part provided with the first excitation electrode and the second excitation electrode, and
   a support part which is provided with the first terminal and the second terminal, and which is thinner than the vibrating part.

9. The vibrator device according to claim 1, wherein the first quartz crystal substrate includes
   a vibrating part provided with the first excitation electrode and the second excitation electrode,
   a support part provided with the first terminal and the second terminal, and
   a coupling part which is located between the vibrating part and the support part, and which is thinner than the vibrating part and the support part.

10. A vibrator module comprising:
the vibrator device according to claim 1.

* * * * *